United States Patent

Roberts et al.

Patent Number: 5,296,809
Date of Patent: Mar. 22, 1994

[54] MAGNETIC RESONANCE EXPERIMENT AND APPARATUS

[76] Inventors: Timothy P. L. Roberts, 4 Romsey Road, Cambridge, England, CB1 3DD; Thomas A. Carpenter, 12 Whitehill Road, Cambridge, England, CB5 8LT; Laurence D. Hall, 22 Long Road, Cambridge, England, CB2 2QS

[21] Appl. No.: 930,653
[22] PCT Filed: Apr. 2, 1991
[86] PCT No.: PCT/GB91/00507
§ 371 Date: Nov. 4, 1992
§ 102(e) Date: Nov. 4, 1992
[87] PCT Pub. No.: WO91/15754
PCT Pub. Date: Oct. 17, 1991

[30] Foreign Application Priority Data
Apr. 4, 1990 [GB] United Kingdom ............ 9007655

[51] Int. Cl.⁵ .................................. G01R 33/20
[52] U.S. Cl. .................................. 324/309; 324/314
[58] Field of Search ............ 324/300, 307, 309, 310, 324/311, 312, 313, 314, 318, 322

[56] References Cited

U.S. PATENT DOCUMENTS

| | | | |
|---|---|---|---|
| 3,812,418 | 5/1974 | Tschopp | 324/307 |
| 4,034,191 | 7/1977 | Tomlinson et al. | 364/485 |
| 4,443,761 | 4/1984 | Levitt | 324/311 |
| 4,837,513 | 6/1989 | Yao | 324/309 |
| 5,125,407 | 6/1992 | Harms et al. | 324/309 |

FOREIGN PATENT DOCUMENTS 0132337 1/1985 European Pat. Off. .
0209374 1/1987 European Pat. Off. .
0337587 10/1989 European Pat. Off. .

Primary Examiner—Michael J. Tokar
Attorney, Agent, or Firm—Brumbaugh, Graves, Donohue & Raymond

[57] ABSTRACT

A magnetic resonance experiment is described in which a sample under test is subjected to a sequence of gradient magnetic fields and RF pulses and resultant pulse echoes are monitored. At least one of the RF pulses comprises a prefocused, phase-modulated, time-asymmetric RF pulse.

7 Claims, 5 Drawing Sheets

MAGNETIC RESONANCE EXPERIMENT AND APPARATUS

BACKGROUND OF THE INVENTION

The invention relates to a magnetic resonance experiment in which a sample under test is subjected to a sequence of gradient magnetic fields and radio frequency pulses and resultant pulse echoes are monitored. The invention also relates to apparatus for performing such an experiment.

In a typical magnetic resonance imaging experiment, after initial excitation of selected spins, in which spins at different spatial positions are encoded with different resonant frequencies by the superposition of a linear magnetic field gradient upon the main field, the signal detection must take place in the presence of a similar field gradient, in order for the spatial encoding to be maintained. In the presence of this gradient, spins have different precessional frequencies, and so dephase. Fourier imaging techniques rely on phase-encoding, that is the application of a known gradient (in the second imaging direction), between initial excitation and signal acquisition. The value of this phase-encoding gradient is incremented from scan to scan. Thus signal acquisition may not occur immediately after excitation. In order to be acquiring at the moment when the spins are in phase, it is necessary to first apply a negative gradient (in the first imaging direction). This allows spins to dephase by a certain amount before signal acquisition commences. During acquisition, as the spins rephase, the signal intensity rises to a maximum and then decreases again as the spins continue to precess at different frequencies. This signal is called the echo. The fourier transform of this echo yields the frequency (and hence spatial) profile of the excitation.

When performing large flip angle gradient recalled echo experiments with slice selective pulses, a build up of transverse coherences occurs, causing transverse steady state artefacts in the resultant image, due to the formation of undesired spin echoes and stimulated echoes. The required $T_1$-dependence of the signal intensity is essentially destroyed by these extra signals.

Methods to "spoil", or destroy, these transverse coherences have employed variable addition gradient pulses or radio frequency methods in which successive pulses have little or no phase coherence. The former suffers not only because "extra" gradients can in fact refocus undesired coherences, but also as they introduce further eddy currents, which result in localised distortions in the magnetic field. Radio frequency methods in which phase coherence between successive pulses is removed are difficult to implement precisely and some transverse coherences persist and, in fact additional gradients are also required to prevent cancellation between the phase-encoding required in image formation and the phase offset supplied to remove coherence between pulses.

In accordance with one aspect of the present invention, a magnetic resonance experiment in which a sample under test is subjected to a sequence of gradient magnetic fields and radio frequency pulses and resultant pulse echoes are monitored is characterised in that at least one of the radio frequency pulses is a prefocused, phase-modulated, time-asymmetric radio frequency pulse.

In accordance with a second method of the present invention, apparatus for performing a magnetic resonance experiment comprises magnetic field generating means for subjecting a sample under test to a sequence of gradient magnetic fields; an RF pulse generator; and means for monitoring resultant pulse echoes and is characterised in that the RF pulse generator generates a prefocused, phase-modulated, time asymmetric RF pulse.

SUMMARY OF THE INVENTION

We have devised a new type of RF pulse which has the principle advantage of "spoiling" transverse coherences whilst exciting selected longitudinal magnetization. Consequently, images derived using this technique do not suffer from the steady state artefacts which arise as a result of transverse coherence build-up. A second benefit is that it obviates the requirement for refocussing gradient lobes (as there is little phase dispersion across the excited magnetization).

It is, in fact, surprising that a phase-modulated, time-asymmetric pulse, designed to excite selected longitudinal magnetization with no phase dispersion (i.e. prefocus) would at the same time "spoil", existing transverse magnetization. This feature makes the pulse extremely useful in nuclear magnetic resonance (NMR) sequences which would otherwise require explicit magnetization spoiling mechanisms. Such sequences include FLASH (for fast imaging with $T_1$ contrast) and STEAM (for localized imaging and spectroscopy). Conventional spoiling techniques involve more field gradient application with consequent implementation problems and eddy current build up, leading to signal degradation. The new sequences, containing fewer elements, are simpler to set up and implement.

The pulse, which could be used for a variety of purposes and include 45°, 90°, and 180° flip angle pulses, is preferably derived using a simulated annealing technique. Simulated annealing is a numerical optimization technique in this case applied as the pulse modulation envelope is varied to give an optimized excitation profile in the frequency domain. Successive pulses are graded in terms of the discrepancy between their excitation profile and a desired one. In general this discrepancy is sought to be reduced. However, traditional optimization methods can arrive at "false" optimal solutions. Simulated annealing is based on an analogy to the thermodynamic process of a molten crystal cooling. At a given temperature there is a finite probability (given by Boltzmann statistics) of the system adopting a less energetically favourable structure which may be an intermediate state, allowing access to a much more favourable structure. Similarly, in simulated annealing, the discrepancy, or error function, is allowed a finite probability of becoming worse. Again this gives the opportunity of attaining an intermediate state, allowing access to a superior solution. The technique is described in more detail in "Design and Application of Prefocused Pulses by Simulated Annealing" by T. P. L. Roberts et al, J. Mag Res 89, 595–604 (1990).

Further advantages of using this new type of pulse are that the switching demands imposed on the gradient amplifier of the apparatus are reduced, and secondly the overall sequence length may be considerably shortened.

It will be understood that the method can be performed on essentially conventional magnetic resonance apparatus but in which the RF pulse generator has been programmed to deliver a pulse of the new type.

It should be understood that the "sample" can be an animate or inanimate object.

BRIEF DESCRIPTION OF THE DRAWINGS

Some examples of methods according to the invention will now be described with reference to the accompanying drawings, in which:

FIG. 2b illustrates the phase variation of the pulse shown in FIG. 2a;

DETAILED DESCRIPTION OF THE INVENTION

Figure 1:
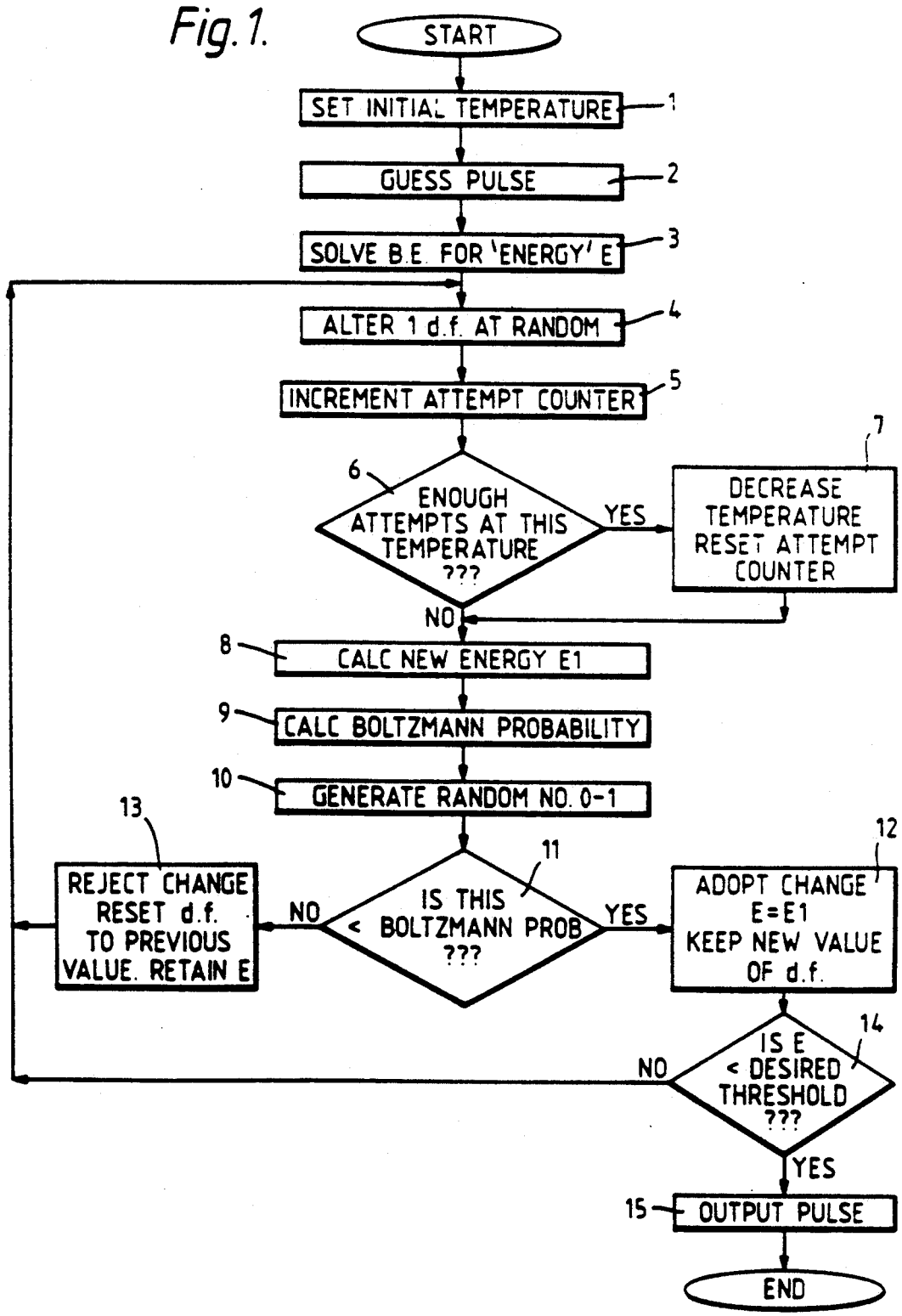
FIG. 1 is a flow diagram illustrating the simulated annealing algorithm.
Figure 2A:
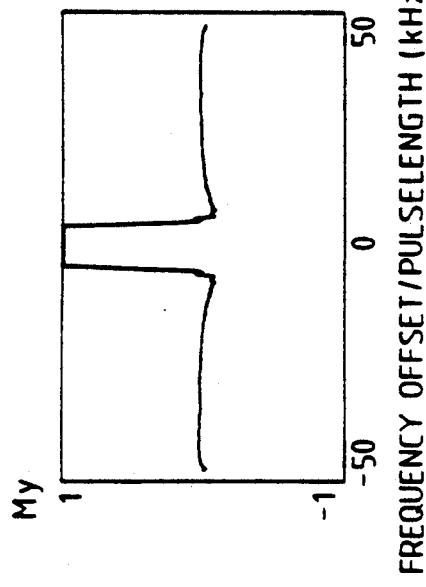
FIG. 2a illustrates the amplitude envelope of one example of a suitable pulse.
Figure 2C:
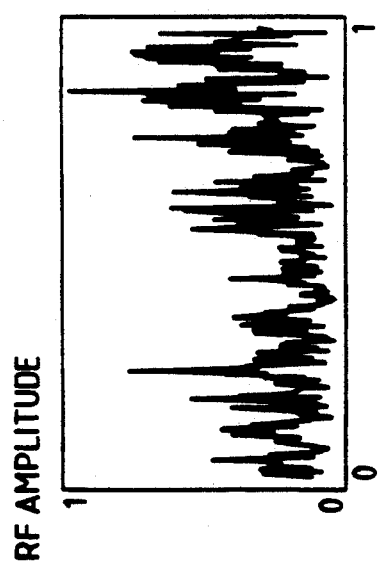
FIG. 2c illustrates the $M_y$ component of magnetization response.
Figure 2B:
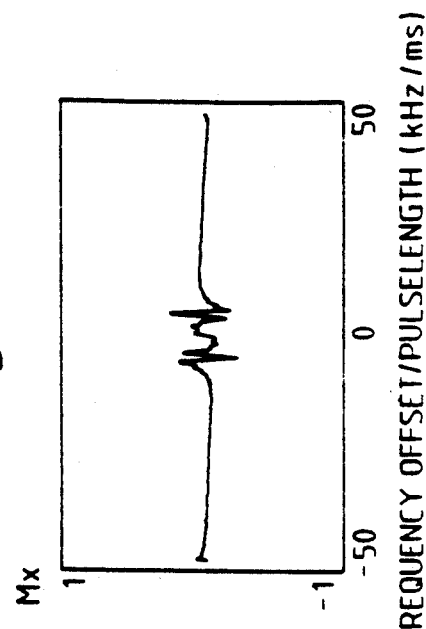
Figure 2D:
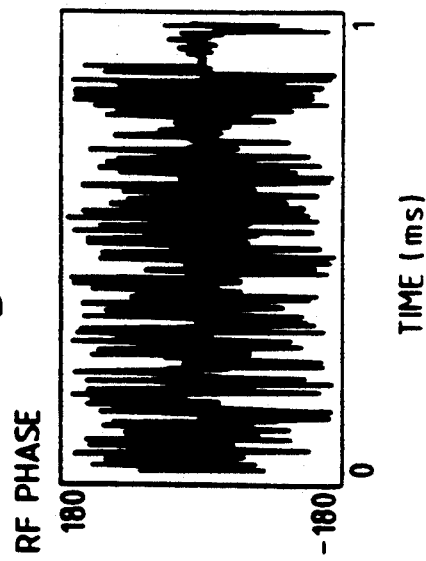
FIG. 2d illustrates the $M_x$ component of magnetization response.

It will first be explained how a suitable RF pulse can be generated. The pulse is generated on a suitably programmed computer which performs the algorithm shown in flow chart form in FIG. 1. In this example, the radio frequency pulse consists of 256 discrete time steps, each of which has an associated amplitude and phase, forming the 512 degrees of freedom of the system. Initially, a temperature T is set by the operator (step 1) and the operator also enters a first definition of a pulse (step 2). The computer evaluates (step 3) the response of the magnetization to a pulse using the Bloch equations, over a set of isochromats spanning the frequency domain. This set of responses is then compared with the desired excitation profile and an error function E constructed such that $$E = \Delta M_x^1 + \Delta M_y^2 + \Delta M_x^2.$$

E is the sum over all considered isochromats of the squares of the deviations from their desired values of the Cartesian components of magnetization.

A change is then made to the pulse, by altering one degree of freedom (d.f.) such as the value of the amplitude or phase variables (step 4). The extent and acceptability of this change may be constrained to represent the experimental system. The corresponding new error function $E_1$ is then determined (step 8). Clearly if $E_1$ is less than E the change produces a pulse shape which has a response closer to the desired one and so the change is accepted (step 12); E is set equal to $E_1$ and the cycle is repeated. algorithm requires that there be a finite chance of making a change to a higher error value. This corresponds in the thermodynamic analogy to adopting a less stable configuration and is the mechanism by which local minima are escaped. This is achieved by first calculating the Boltzmann probability for making the change (step 9), given by $$p = e^{-(E_1 - (E E)/kT}$$

Here p is the probability, k represents Boltzmann's constant, and T corresponds to the "temperature" of the system. Consequently the product kT represents the thermal energy of the system. T is thus a control parameter of the routine which is gradually decreased (step 7) to represent the system cooling into a state with the lowest error value (the global minimum). A random number in the range 0–1 is then generated (step 10) and if this is less than the above calculated probability (step 11), the change is also permitted otherwise step 13 is performed and processing returns to step 4.

Following step 12, if E is less than the desired threshold (step 14) the current pulse is accepted and is output (step 15). If it is not, processing returns to step 4.

In the algorithm, the decision to accept or reject a particular change is dependent on the value of the temperature parameter T. This parameter is reduced (step 7) during successive iterations to represent cooling. It is clear that the number of changes attempted at each temperature level is therefore of great significance, since it indicates the closeness of the model to its thermodynamic analogy. Naturally, some compromise has to be reached: it is not feasible to allow very large numbers of attempted changes as the resulting computing burden would be prohibitive. conversely, if too few attempts are made at each temperature, the system is effectively cooling too fast and the chance of being "frozen" in a local minimum increases. Consequently, steps 5 and 6 are included to limit the number of attempts which are performed at each temperature. The effect of varying the number of attempts is described in more detail in the paper mentioned above which is incorporated herein by reference.

Figure 3A:
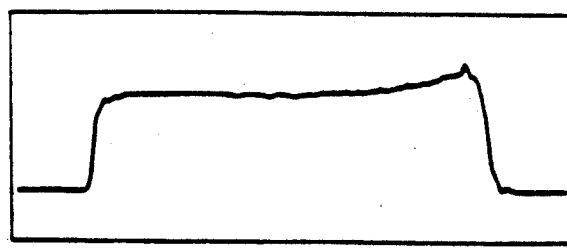
FIGS. 3a–3c illustrate the magnitude response of a non-selective spin-echo sequence and the $M_y$ and $M_x$ components of response respectively.
Figure 3B:
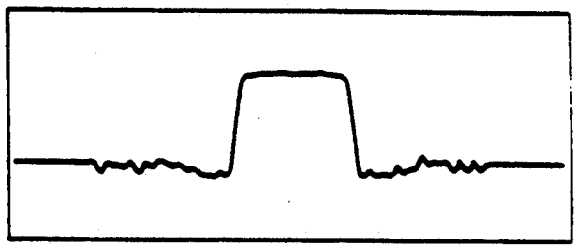
Figure 3C:
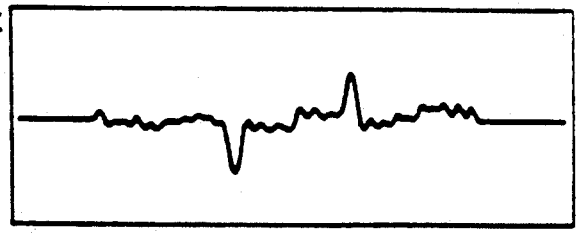

FIG. 2 illustrates an example of the final pulse form as derived using a technique of the type described with reference to FIG. 1. FIG. 2a illustrates the amplitude envelope of the pulse; FIG. 2b the phase variation of the pulse; FIG. 2c the $M_y$ component of magnetization response; and FIG. 2d the $M_x$ component. The pulse shown in FIG. 2 has been used in experimental trials using an Oxford Research Systems BIOSPEC 1 system with a 2T, 31 cm bore superconducting magnet. Firstly, the above prefocused pulse was used as a selective 90° pulse in a spin-echo sequence. A slice profile through a square phantom of water (doped with $MnCl_2$ to reduce $T_1$) was obtained, using an echo time (TE) of 34.4 ms. The projected view of the phantom (obtained as the magnitude response to a nonselective spin-echo sequence) is shown in FIG. 3a along with the $M_x$ and $M_y$ components (FIGS. 3b and 3c) of magnetization obtained with the slice-selective sequence.

Figure 4:
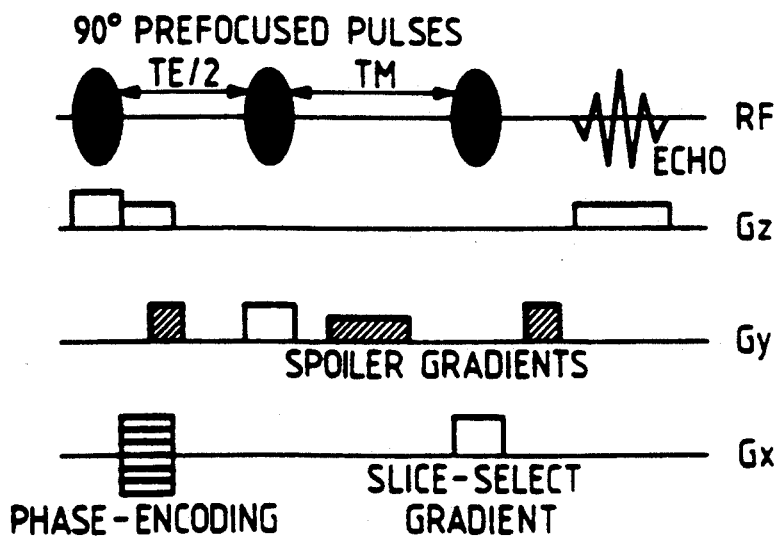
FIG. 4 illustrates a modified STEAM volume-selective imaging sequence.
Figure 5A:
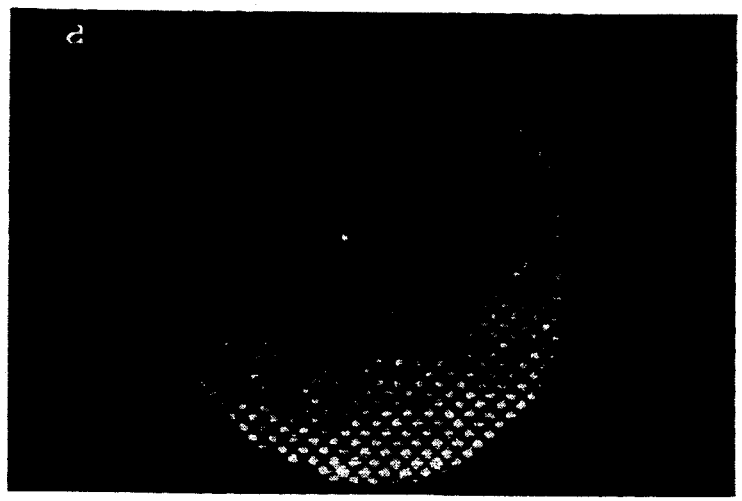
FIG. 5a illustrates a coronal slice image obtained with a spin-echo sequence.
Figure 5B:
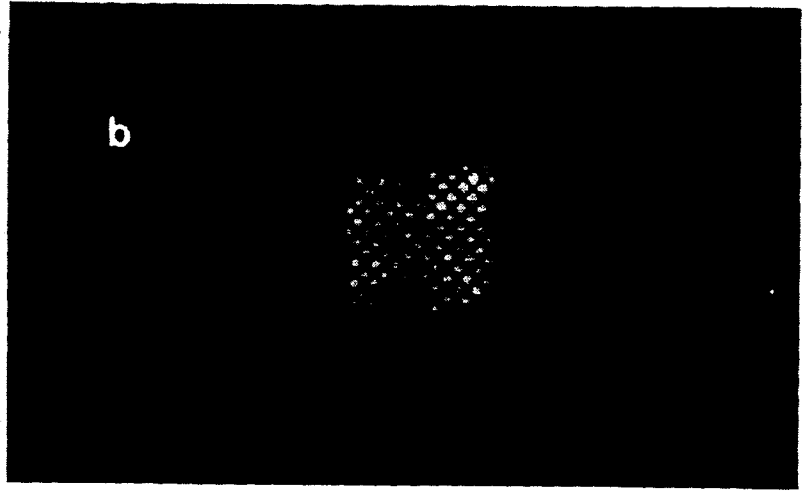
FIG. 5b illustrate the coronal view (7.5×7.5 mm) of a selected volume obtained using prefocused pulses.
Figure 5C:
FIG. 5c illustrates the corresponding view (7.5×7.5 mm) of an identical volume selected using STEAM with sinc-sliced selected pulses.

The prefocused pulse was applied to a modified STEAM sequence, see T. P. L. Roberts, T. A. Carpenter, R. C. Hawkes, and L. D. Hall, Proceedings of the Society of Magnetic Resonance in Medicine, "Works in Progress" 8th Annual Meeting, Amsterdam 1989, p. 1161, in order to image a three-dimensional selected volume. The sequence is shown in FIG. 4 where it can be seen that prefocused pulses with associated simple gradient pulses replace the conventional combination of slice-selective pulses with refocusing gradient lobes. The phantom imaged consisted of a cylindrical vial, filled with water. FIG. 5a shows an image of a coronal slice of thickness 7.5 mm, obtained using a spin-echo imaging sequence. Using the above STEAM sequence, a 7.5×7.5×7.5 mm volume was selected. FIG. 5b shows the corresponding view of this volume. (TE/2=25 ms; TM=100 ms) The spatial selection can be seen to be of good quality, with little signal appearing outside the desired volume. Intrinsically, the STEAM sequence necessitates a loss of a factor of two in signal-to-noise ratio, and this is also observed here. This originates from the fact that the second pulse only affects one component of the in-plane magnetization, the other being dephased in the following spoiler gradient. FIG. 5c shows a corresponding view of the same volume, selected using a conventional STEAM sequence with sinc-type selective pulses and appropriate refocusing gradients. It can be seen in the intensity profiles that the prefocused method defines the region of interest more sharply; there is substantial excitation from the region just outside the selected volume when using the conventional method, resulting in a blurring of the edges of the images.

Figure 6A:
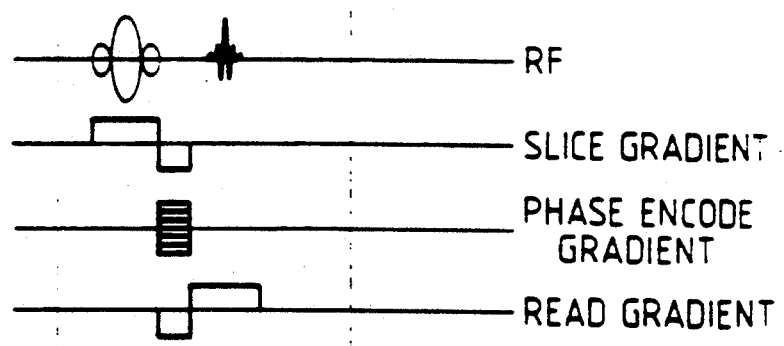
FIG. 6a illustrates a conventional sinc pulse slice selection sequence.
Figure 6B:
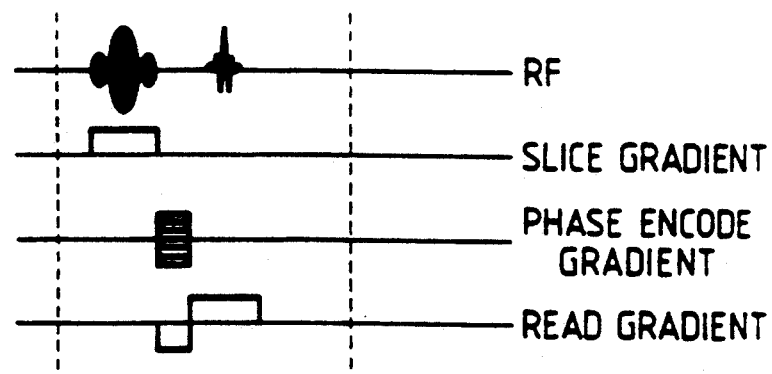
FIG. 6b illustrates a prefocused pulse slice selection sequence.

An example of the application of this new pulse to a FLASH technique is described in detail in "Elimination of Steady-State Magnetization in Fast Gradient-Record Echo-Imaging by the Use of Prefocused Pulses" by T. P. L. Roberts et al J. Mag Res 91, 204–208 (1991). An example of such a pulse sequence is shown in FIG. 6b where it is contrasted with a conventional sinc pulse selection technique (FIG. 6a) It will be noted that in FIG. 6a a gradient lobe is needed to refocus spins after the selective pulse and this is not required in the sequence of FIG. 6b.

Other applications of the new pulse include flow-measurement and magnetic resonance angiography experiments, involving selective excitation; volume localization by multiple plane selection for imaging and spectroscopy; and Phase-coherent chemical shift selection in 2D, 3D and 4D chemical shift imaging experiments.

What is claimed is:

1. Magnetic resonance apparatus comprising magnetic field generating means for subjecting a sample under test to a sequence of magnetic field gradients; an RF pulse generator; and means for monitoring resultant pulse echoes characterized int hat the RF pulse generator generates a prefocused, phase-modulated, time-asymmetric RF pulse.

2. A method for obtaining a magnetic resonance image of a sample, comprising
   subjecting the sample to a sequence of gradient magnetic fields and RF pulses, and
   monitoring the resultant pulse echoes, wherein at least one of the RF pulses is a prefocused, phase-modulated, time-asymmetric RF pulse.

3. A method according to claim 2, wherein the prefocused, phase-modulated time asymmetric RF pulse is generating using a simulated annealing technique.

4. A method according to claim 2, wherein the sample is subjected to a FLASH sequence.

5. A method according to claim 2, wherein the sample is subjected to a STEAM sequence.

6. A method according tot claim 3, wherein the sample is subjected to a FLASH sequence.

7. A method according to claim 3, wherein the sample is subjected to a steam sequence.

* * * * *